US009780164B2

(12) United States Patent
Li et al.

(10) Patent No.: US 9,780,164 B2
(45) Date of Patent: Oct. 3, 2017

(54) SILICON-ON-INSULATOR RADIO FREQUENCY DEVICE AND SILICON-ON-INSULATOR SUBSTRATE

(71) Applicant: Shanghai Huahong Grace Semiconductor Manufacturing Corporation, Shanghai (CN)

(72) Inventors: Ernest Li, Shanghai (CN); Daniel Xu, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 41 days.

(21) Appl. No.: 14/134,432

(22) Filed: Dec. 19, 2013

(65) Prior Publication Data

US 2014/0175598 A1    Jun. 26, 2014

(30) Foreign Application Priority Data

Dec. 21, 2012  (CN) .......................... 2012 1 0564175

(51) Int. Cl.
| | |
|---|---|
| *H01L 21/70* | (2006.01) |
| *H01L 29/06* | (2006.01) |
| *H01L 21/762* | (2006.01) |
| *H01L 21/84* | (2006.01) |
| *H01L 27/12* | (2006.01) |

(52) U.S. Cl.
CPC .... *H01L 29/0649* (2013.01); *H01L 21/76283* (2013.01); *H01L 21/84* (2013.01); *H01L 27/1203* (2013.01)

(58) Field of Classification Search
CPC . H01L 29/0649; H01L 27/1203; H01L 21/84; H01L 21/76283
USPC ........................................................ 257/507
See application file for complete search history.

(56) References Cited

U.S. PATENT DOCUMENTS

| | | | |
|---|---|---|---|
| 8,421,193 B2* | 4/2013 | Huang .......................... 257/621 |
| 8,481,405 B2* | 7/2013 | Arriagada et al. ............ 438/455 |
| 2008/0290524 A1* | 11/2008 | Lanzerotti ......... H01L 21/76898 257/770 |
| 2009/0206449 A1* | 8/2009 | Cooney III ....... H01L 21/76224 257/593 |
| 2010/0035403 A1* | 2/2010 | Brown .............. H01L 21/76224 438/422 |
| 2011/0018060 A1* | 1/2011 | Botula et al. ................. 257/347 |

(Continued)

*Primary Examiner* — Phat X Cao
*Assistant Examiner* — Mohammad M Hoque
(74) *Attorney, Agent, or Firm* — Harness, Dickey & Pierce, P.L.C.

(57) ABSTRACT

A silicon-on-insulator radio frequency device and a silicon-on-insulator substrate are provided. In the silicon-on-insulator radio frequency device, a pit is formed on a surface of a high resistivity silicon plate which is close to a buried oxide layer. The pit may be filled with an insulating material, thereby increasing an equivalent surface resistance of the high resistivity silicon plate; or no insulating material is filled into the pit, that is, the pit remains a vacuum state or is only filled with air, which can increase the equivalent surface resistance of the high resistivity silicon plate as well. In such, an eddy current generated on a surface of the high resistivity silicon plate under the action of a radio frequency signal may be reduced. As a result, loss of the radio frequency signal is reduced and the linearity of the radio frequency signal is improved.

15 Claims, 5 Drawing Sheets

(56) References Cited

U.S. PATENT DOCUMENTS

2012/0038024 A1* 2/2012 Botula et al. ................. 257/510
2014/0054698 A1* 2/2014 Liu ................... H01L 21/76202
                                                             257/347

* cited by examiner

SILICON-ON-INSULATOR RADIO FREQUENCY DEVICE AND SILICON-ON-INSULATOR SUBSTRATE

CROSS-REFERENCE TO RELATED APPLICATIONS

The present application claims priority to Chinese patent application No. 201210564175.6, filed on Dec. 21, 2012, and entitled "SILICON-ON-INSULATOR RADIO FREQUENCY DEVICE AND SILICON-ON-INSULATOR SUBSTRATE", and the entire disclosure of which is incorporated herein by reference.

FIELD OF THE DISCLOSURE

The present disclosure generally relates to semiconductor manufacturing, and more particularly, to a silicon-on-insulator radio frequency device and a silicon-on-insulator substrate.

BACKGROUND OF THE DISCLOSURE

Semiconductor devices are developed to have higher integration, higher speed and lower power consumption, which limit the application of bulk silicon substrates more and more. On the contrary, Silicon-On-Insulator (SOI) substrates can realize dielectric isolation of components in an integrated circuit, avoid a latch-up effect in a bulk silicon Complementary Metal Oxide Semiconductor (CMOS) circuit, have the advantages of small parasitic capacitance, high integration, high speed, simple process and small short-channel effect, and are suitable to be used in low-power-consumption low-voltage circuits. Therefore, SOI substrates are used more and more widely to form semiconductor devices. In a radio frequency (RF) device, a SOI substrate may be employed to reduce parasitic capacitance of the substrate. Besides, the SOI substrate may improve high-frequency characteristics and operational speed of the RF device.

Referring to FIG. 1, FIG. 1 schematically illustrates a sectional view of a SOI RF device in conventional technologies. A SOI substrate 1 includes a high resistivity silicon plate 2, a buried oxide layer 3 on the high resistivity silicon plate 2 and a top silicon layer 4 on the buried oxide layer 3, wherein a Shallow Trench Isolation (STI) structure 5 is formed in the top silicon layer 4 to separate active regions in the top silicon layer 4. A semiconductor device, such as a transistor, is formed in the active regions. A metal interconnect structure is formed on the SOI substrate 1. One-layer metal interconnect structure is taken as an example in FIG. 1. The one-layer metal interconnect structure includes the top silicon layer 4, an interlayer dielectric layer 6 on the STI structure 5, a conductive plug formed in the interlayer dielectric layer 6 and a metal layer 7 on the interlayer dielectric layer 6 and the conductive plug. At least a portion of the STI structure 5 is covered by the metal layer 7.

However, in practice, especially in RF applications which require high linearity and low insertion loss, if the above SOI RF device is employed, loss of RF signals may be great and linearity of the RF signals may be poor.

SUMMARY

In some RF applications which require high linearity and low insertion loss, loss and linearity of signals in conventional SOI RF devices cannot reach application requirements.

The inventors found reasons for the above problem may be as follows. An external circuit applies a RF signal or a combinational signal of a RF signal and a direct current (DC) signal to a SOI RF device. The RF signal or the combinational signal can be transmitted in a metal interconnect structure in the SOI RF device. As shown in FIG. 1, since a high resistivity silicon plate 2 has a low doping content, under the action of a metal layer 7 applied with the RF signal or the combinational signal and the action of fixed charges in the buried oxide layer 3, an inversion layer 8 may be formed on a surface of the high resistivity silicon plate 2 directly under the metal layer 7 which is close to the buried oxide layer 3. As a result, a surface resistance of the high resistivity silicon plate 2 is reduced and the conductivity thereof is enhanced. In such, the metal layer 7, the high resistivity silicon plate 2 directly under the metal layer 7, and the interlayer dielectric layer 6 and the STI structure 5 between the metal layer 7 and the high resistivity silicon plate 2 may be considered to constitute a capacitor C. In the capacitor C, the metal layer 7 and the high resistivity silicon plate 2 may be taken as two polar plates thereof, and the interlayer dielectric layer 6 and the STI structure 5 may be taken as a dielectric layer between the two polar plates of the capacitor C. Since a RF signal or a combinational signal of a RF signal and a DC signal is applied to the metal layer 7 and a RF signal generally is a signal which varies with time, the RF signal or the combinational signal may be coupled to the high resistivity silicon plate 2 through the capacitor C. Besides, an electromagnetic field generated by the RF signal may form an eddy current on a surface of the high resistivity silicon plate 2, which results in loss of the RF signal and low signal linearity.

In embodiments of the present disclosure, a SOI RF device may be provided, including:
  a SOI substrate, the SOI substrate including a high resistivity silicon plate, a top silicon layer and a buried oxide layer between the high resistivity silicon plate and the top silicon layer, wherein at least two active regions are formed in the top silicon layer and a STI structure is formed to separate two adjacent active regions of the at least two active regions;
  a first pit formed in the SOI substrate, wherein the number of the first pit is at least one, an opening of the first pit faces a surface of the high resistivity silicon plate which is away from the buried oxide layer, and the first pit extends along a thickness direction of the SOI substrate and penetrates through the high resistivity silicon plate; and
  a metal interconnect structure formed on the top silicon layer and the SOI structure, the metal interconnect structure including an interlayer dielectric layer formed on the top silicon layer and the STI structure and a metal layer formed on the interlayer dielectric layer.

Optionally, at least one of the first pit is disposed directly under the STI structure.

Optionally, the at least one of the first pit directly under the STI structure may exactly penetrate the high resistivity silicon plate, or penetrate the high resistivity silicon plate and a portion of the buried oxide layer, or penetrate the high resistivity silicon plate and the buried oxide layer, or penetrate the high resistivity silicon plate, the buried oxide layer and a portion of the STI structure.

Optionally, at least one of the first pit is disposed directly under the at least two active regions.

Optionally, the at least one of the first pit directly under the at least two active regions may exactly penetrate the high resistivity silicon plate, or penetrate the high resistivity silicon plate and a portion of the buried oxide layer, or penetrate the high resistivity silicon plate and the buried oxide layer.

Optionally, the number of the first pit is at least two, at least one of the first pit is disposed directly under the STI structure and at least one of the first pit is disposed directly under the at least two active regions.

Optionally, the at least one of the first pit directly under the STI structure may exactly penetrate the high resistivity silicon plate, or penetrate the high resistivity silicon plate and a portion of the buried oxide layer, or penetrate the high resistivity silicon plate and the buried oxide layer, or penetrate the high resistivity silicon plate, the buried oxide layer and a portion of the STI structure; and the at least one of the first pit directly under the at least two active regions may exactly penetrate the high resistivity silicon plate, or penetrate the high resistivity silicon plate and a portion of the buried oxide layer, or penetrate the high resistivity silicon plate and the buried oxide layer.

Optionally, the first pit may be a via or a trench.

Optionally, the first pit may include at least two vias and two adjacent vias may be arranged with an interval therebetween; or the first pit may include at least two trenches and two adjacent trenches may be arranged with an interval therebetween or arranged across each other.

Optionally, the first pit may be filled with an insulating material or not filled.

Optionally, the first pit may be filled with an insulating material which includes silicon oxide or silicon nitride.

Optionally, the SOI RF device may further include a second pit formed in the SOI substrate, wherein the number of the second pit is at least one, an opening of the second pit faces a surface of the STI structure which is away from the buried oxide layer, and the second pit extends along the thickness direction of the SOI substrate, penetrates the STI structure, the buried oxide layer and a portion of the high resistivity silicon plate and is filled with an insulating material.

Optionally, the insulating material may include silicon oxide or silicon nitride.

Optionally, the second pit may extend for about 1 percent to about 90 percent of a thickness of the high resistivity silicon plate.

Optionally, the second pit may be a via or a trench.

Optionally, the second pit may include at least two vias and two adjacent vias may be arranged with an interval therebetween, or the second pit may include at least two trenches and two adjacent trenches may be arranged with an interval therebetween or arranged across each other.

Optionally, the SOI RF device may be a RF switch.

In an embodiment, a SOI RF device may be provided, including:
  a SOI substrate, the SOI substrate including a high resistivity silicon plate, a top silicon layer and a buried oxide layer between the high resistivity silicon plate and the top silicon layer, wherein at least two active regions are formed in the top silicon layer and a STI structure is formed to separate two adjacent active regions of the at least two active regions; and
  a pit formed in the SOI substrate, wherein the number of the pit is at least one, an opening of the pit faces a surface of the STI structure which is away from the buried oxide layer, and the pit extends along a thickness direction of the SOI substrate, penetrates the STI structure, the buried oxide layer and a portion of the high resistivity silicon plate, and is filled with an insulating material.

Optionally, the insulating material may include silicon oxide or silicon nitride.

Optionally, the pit may extend for about 1 percent to about 90 percent of a thickness of the high resistivity silicon plate.

Optionally, the pit may be a via or a trench.

Optionally, the pit may include at least two vias and two adjacent vias may be arranged with an interval therebetween, or the pit may include at least two trenches and two adjacent trenches may be arranged with an interval therebetween or arranged across each other.

Optionally, the SOI RF device may be a radio frequency switch.

In an embodiment, a SOI substrate may be provided, including:
  a high resistivity silicon plate, a top silicon layer and a buried oxide layer between the high resistivity silicon plate and the top silicon layer, wherein a pit is formed in the SOI substrate, the number of the pit is at least one, an opening of the at least one pit faces a surface of the high resistivity silicon plate which is away from the buried oxide layer, and the pit extends along a thickness direction of the SOI substrate and penetrates through the high resistivity silicon plate.

Optionally, the pit may exactly penetrate the high resistivity silicon plate, or penetrate the high resistivity silicon plate and a portion of the buried oxide layer, or penetrate the high resistivity silicon plate and the buried oxide layer.

Optionally, the pit may be a via or a trench.

Optionally, the pit may include at least two vias and two adjacent vias may be arranged with an interval therebetween, or the pit may include at least two trenches and two adjacent trenches may be arranged with an interval therebetween or arranged across each other.

Optionally, the pit may be filled with an insulating material or not filled.

Optionally, the pit may be filled with an insulating material which includes silicon oxide or silicon nitride.

Compared with the conventional solutions, the present disclosure may have following advantages.

In the SOI RF device provided in the present disclosure, a pit is formed on a surface of a high resistivity silicon plate which is close to a buried oxide layer. The pit may be filled with an insulating material, thereby increasing an equivalent surface resistance of the high resistivity silicon plate; or no insulating material is filled into the pit, that is, the pit remains a vacuum state or is only filled with air, which can increase the equivalent surface resistance of the high resistivity silicon plate as well. In such, an eddy current generated on a surface of the high resistivity silicon plate under the action of a RF signal may be reduced. As a result, loss of the RF signal may be reduced and the linearity of the RF signal may be improved.

DETAILED DESCRIPTION OF THE DISCLOSURE

In some RF applications which require high linearity and low insertion loss, loss and linearity of RF signals in conventional SOI RF devices cannot meet the application requirements. In embodiments of the present disclosure, in a SOI substrate which is used to form a RF device, at least one pit is formed on a surface of a high resistivity silicon plate which is close to a buried oxide layer to increase an equivalent surface resistance of the high resistivity silicon plate. Therefore, an eddy current generated on a surface of the high resistivity silicon plate under the action of a RF signal may be reduced. As a result, loss of the RF signals may be reduced and the linearity of the RF signals may be improved.

In order to clarify the objects, characteristics and advantages of the disclosure, embodiments of present disclosure will be described in detail in conjunction with accompanying drawings. The following embodiments are only illustrative. Those skilled in the art can modify and vary the embodiments without departing from the spirit and scope of the present disclosure.

Figure 1:
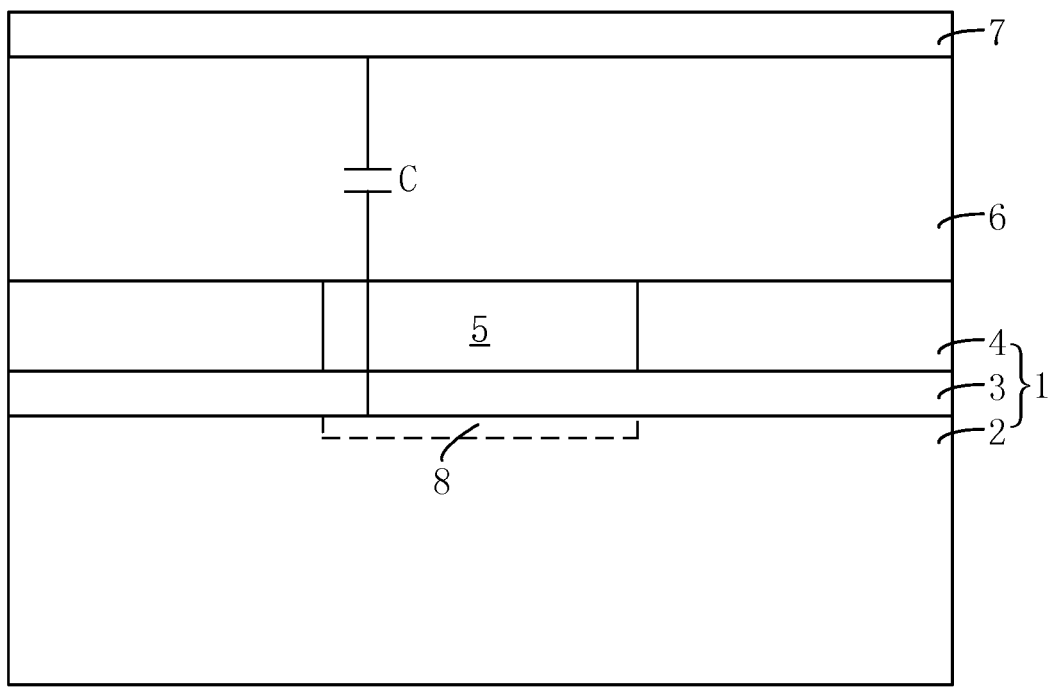
FIG. 1 schematically illustrates a sectional view of a conventional SOI RF device.
Figure 2:
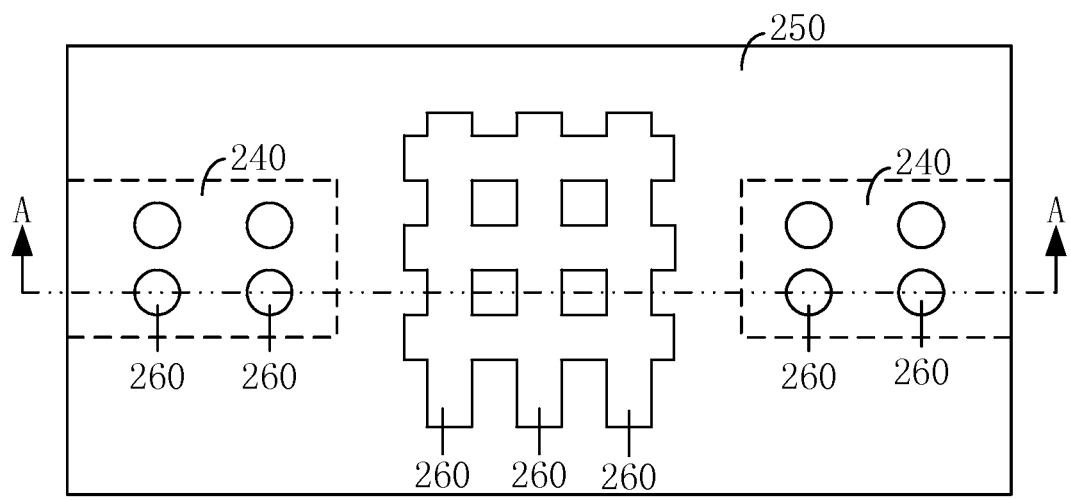
FIG. 2 schematically illustrates an upward view of a SOI RF device according to an embodiment of the present disclosure.
Figure 3:
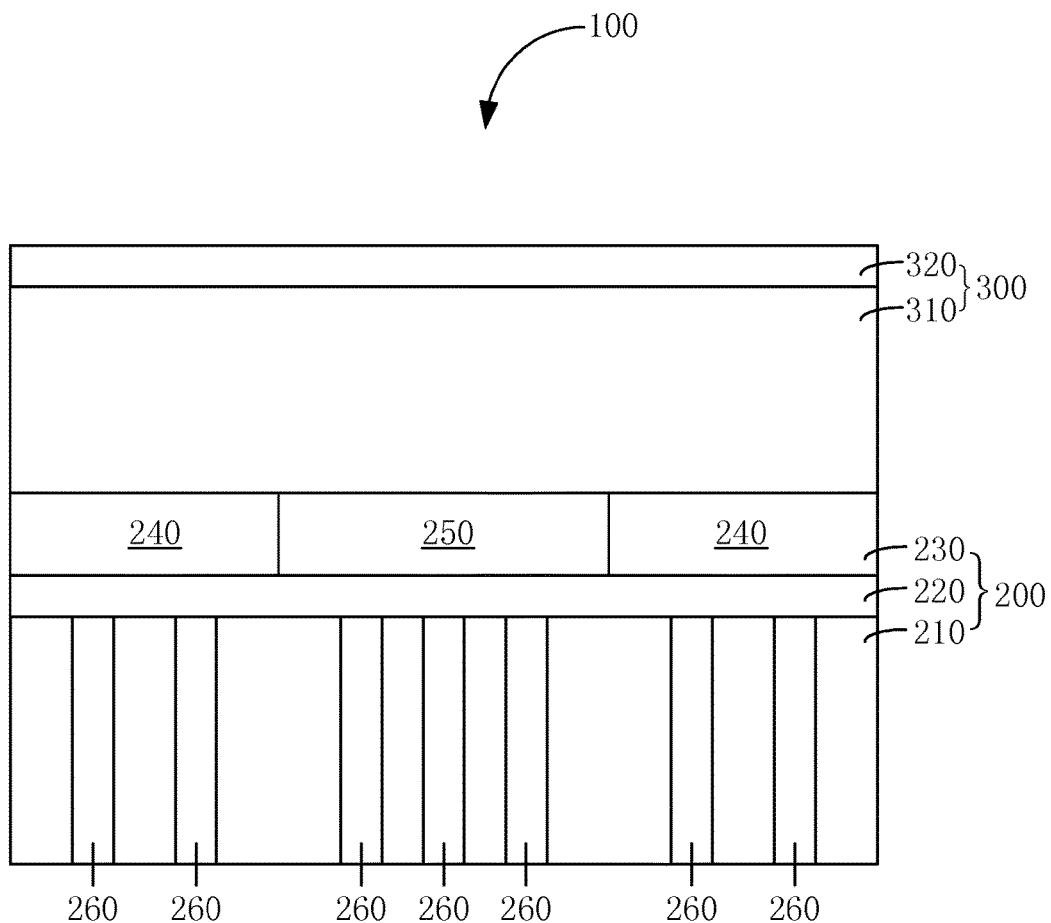
FIG. 3 schematically illustrates a sectional view of the SOI RF device shown in FIG. 2 along an A-A line.

FIG. 2 schematically illustrates an upward view of a SOI RF device according to an embodiment of the present disclosure and FIG. 3 schematically illustrates a sectional view of the SOI RF device shown in FIG. 2 along an A-A line. Referring to FIGS. 2 and 3, a SOI RF device 100 includes a SOI substrate 200 and a metal interconnect structure 300 formed on the SOI substrate 200. A plurality of semiconductor devices are formed in the SOI substrate 200. The metal interconnect structure 300 may connect the plurality of semiconductor devices to form a desired circuit.

In some embodiments, the SOI substrate 200 may include a high resistivity silicon plate 210, a top silicon layer 230 and a buried oxide layer 220 between the high resistivity silicon plate 210 and the top silicon layer 230. The high resistivity silicon plate 210 is adapted to provide mechanical support for the buried oxide layer 220 and the top silicon layer 230. The high resistivity silicon plate 210 is a silicon plate having a resistivity greater than 200 Ω·cm. The top silicon layer 230 may be adapted to manufacture semiconductor devices required in a circuit. At least two active regions 240 are formed in the top silicon layer 230. Various semiconductor devices, such as a p-n junction diode, a bipolar transistor (BJT), a Schottky diode and a field-effect transistor (FET), are formed in the at least two active regions 240. Two adjacent active regions 240 are separated by a STI structure 250.

At least one first pit 260 is formed in the SOI substrate 200. An opening of the first pit 260 faces a surface of the high resistivity silicon plate 210 which is away from the buried oxide layer 220 (i.e, a lower surface of the high resistivity silicon plate 210). In some embodiments, the first pit 260 extends along a thickness direction of the SOI substrate 200 and penetrates through the high resistivity silicon plate 210. Namely, a depth of the first pit 260 is greater than or equal to a thickness of the high resistivity silicon plate 210. If the first pit 260 exactly penetrates the high resistivity silicon plate 210, the depth of the first pit 260 is equal to the thickness of the high resistivity silicon plate 210. In some embodiments, the first pit 260 may penetrate the high resistivity silicon plate 210 and a portion of the buried oxide layer 220, that is, the depth of the first pit 260 is greater than the thickness of the high resistivity silicon plate 210 and smaller than a sum of the thickness of the high resistivity silicon plate 210 and a thickness of the buried oxide layer 220. In some embodiments, the first pit 260 may penetrate the high resistivity silicon plate 210 and the buried oxide layer 220, that is, the depth of the first pit 260 is equal to a sum of the thickness of the high resistivity silicon plate 210 and the thickness of the buried oxide layer 220.

In some embodiments, the first pit 260 may be disposed directly under the STI structure 250, directly under the active regions 240 or directly under a juncture of the STI structure 250 and the active regions 240.

In some embodiments, at least one first pit 260 is disposed directly under the STI structure 250. In this case, the first pit 260 may exactly penetrate the high resistivity silicon plate 210, or penetrate the high resistivity silicon plate 210 and a portion of the buried oxide layer 220, or penetrate the high resistivity silicon plate 210 and the buried oxide layer 220. In some embodiments, the first pit 260 may penetrate the high resistivity silicon plate 210, the buried oxide layer 220 and a portion of the STI structure 250, that is, the depth of the first pit 260 is greater than a sum of the thickness of the high resistivity silicon plate 210 and the thickness of the buried oxide layer 220. Since the first pit 260 does not penetrate the whole STI structure 250, there is still a portion of the STI structure 250 covering the first pit 260.

In some embodiments, at least one first pit 260 is disposed directly under the at least two active regions 240. In this case, the first pit 260 may exactly penetrate the high resistivity silicon plate 210, or penetrate the high resistivity silicon plate 210 and a portion of the buried oxide layer 220, or penetrate the high resistivity silicon plate 210 and the buried oxide layer 220.

In some embodiments, at least two first pits 260 are formed in the SOI substrate 200, at least one first pit 260 disposed directly under the STI structure and at least one first pit 260 disposed directly under the at least two active regions 240. The at least one first pit 260 directly under the STI structure 250 may exactly penetrate the high resistivity silicon plate 210, or penetrate the high resistivity silicon plate 210 and a portion of the buried oxide layer 220, or penetrate the high resistivity silicon plate 210 and the buried oxide layer 220, or penetrate the high resistivity silicon plate 210, the buried oxide layer 220 and a portion of the shallow trench isolation structure 250. The at least one first pit 260 directly under the at least two active regions 240 may exactly penetrate the high resistivity silicon plate 210, or penetrate the high resistivity silicon plate 210 and a portion of the buried oxide layer 220, or penetrate the high resistivity silicon plate 210 and the buried oxide layer 220.

In some embodiments, the at least one first pit 260 may have various shapes. In some embodiments, to simply a manufacturing process of the first pit 260, the first pit 260 may be a via. In some embodiments, the first pit 260 may be a trench. It should be noted that, the shape and distribution of the at least one first pit 260 are not limited to embodiments described here and the accompanying figures. When at least two first pits 260 are formed in the SOI substrate 200 and the at least two first pits 260 are vias, two adjacent vias are arranged with an interval therebetween. When at least two first pits 260 are formed in the SOI substrate 200 and the at least two first pits 260 are trenches, two adjacent trenches are arranged with an interval therebetween (arranged in parallel in FIG. 2) or arranged across each other (arranged perpendicular to each other in FIG. 2).

The number and a cross section area of the at least one first pit 260 in the SOI substrate 200 may influence an equivalent surface resistance of the high resistivity silicon plate 210. The more the number of the at least one first pit 260 is or the greater the cross section area of the at least one first pit 260 is, the greater the equivalent surface resistance of the high resistivity silicon plate 210 is, which greatly reduces an eddy current generated on a surface of the high resistivity silicon plate 210. Considering that the high resistivity silicon plate 210 needs to provide mechanical support for above structures (i.e, the buried oxide layer 220 and the top silicon layer 230), the number and the cross section area of the at least one first pit 260 should be set reasonably to ensure an adequate support strength. In some embodiments, the first pit 260 may be formed by a dry etching process. The smaller the cross section area of the first pit 260 is, the more complicated the process for forming the first pit 260 is. Therefore, the cross section area of the first pit 260 should be set based on the ability of existing etching processes. In some embodiments, when the first pit 260 is a via, a diameter thereof may be set between about 0.2 µm to about 1 mm.

In some embodiments, the at least one first pit 260 may be formed in the SOI substrate 200 after all the circuit structures (including the metal interconnect structure 300) are formed on the SOI substrate 200. In some embodiments, the at least one first pit 260 may be formed in the SOI substrate 200 before circuit structures are formed on the SOI substrate 200.

The first pit 260 may at least penetrate the high resistivity silicon plate 210, that is, the depth of the first pit 260 is greater than or equal to the thickness of the high resistivity silicon plate 210. Since the thickness of the high resistivity silicon plate 210 is relatively great, the depth of the first pit 260 is relatively great as well and a manufacturing process thereof may be very complicated. Since an eddy current is only generated on a surface of the high resistivity silicon plate 210 which is close to the buried oxide layer 220, to increase an equivalent surface resistance of the high resistivity silicon plate 210, the first pit 260 may be enabled to penetrate the high resistivity silicon plate 210 to the surface of the high resistivity silicon plate 210 which is close to the buried oxide layer 220. In some embodiments, the first pit 260 may exactly penetrate the high resistivity silicon plate 210.

In some embodiments, the at least one first pit 260 may be filled with an insulating material, such as a material having good insulating performance, including silicon oxide or silicon nitride. In some embodiments, no material is filled into the at least one first pit 260. In such, the at least one first pit 260 remains a vacuum state or only contacts with air. No matter the at least one first pit 260 is filled with an insulating material or not, the surface resistance of the high resistivity silicon plate 210 is increased. Further, an eddy current generated on a surface of the high resistivity silicon plate 210 may be reduced. It should be noted that, when the first pit 260 has a great depth-to-width ratio, an insulating material may not fill the first pit 260 and this does not influence applications of the present disclosure.

Figure 4:
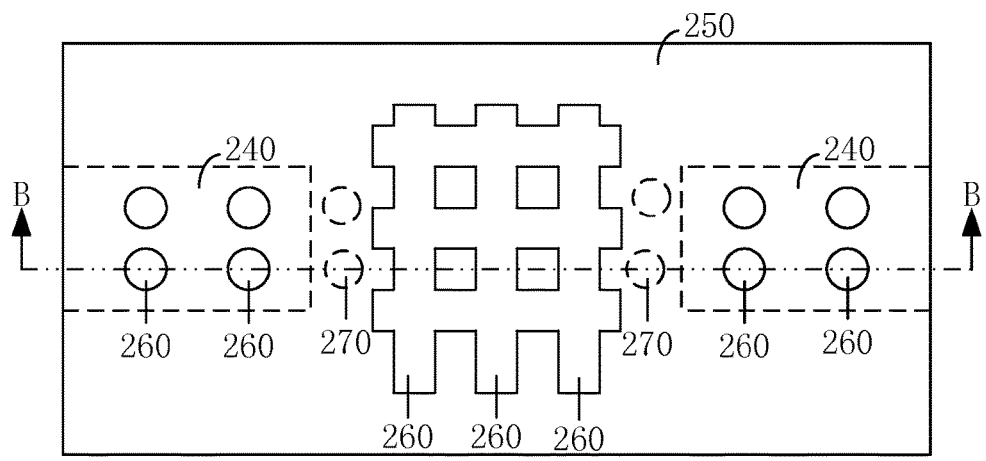
FIG. 4 schematically illustrates an upward view of a SOI RF device according to another embodiment of the present disclosure.
Figure 5:
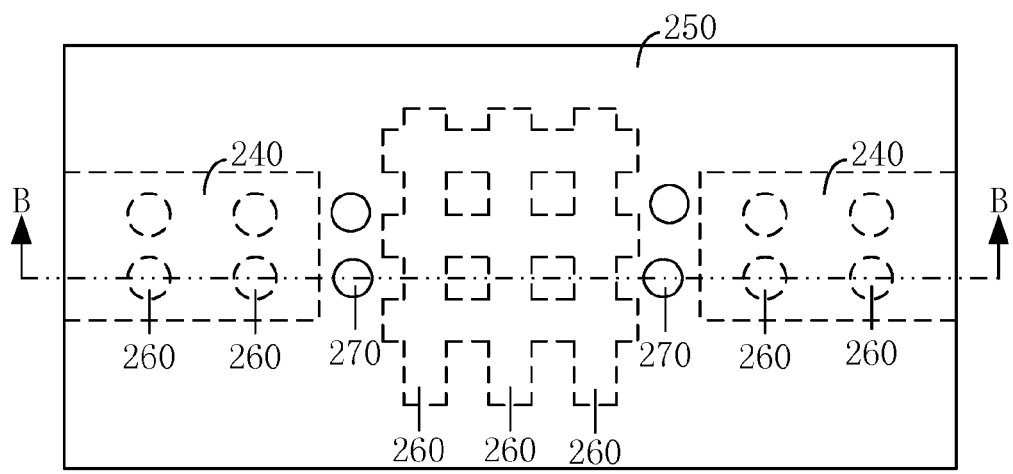
FIG. 5 schematically illustrates a vertical view of the SOI RF device shown in FIG. 4.
Figure 6:
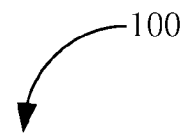
FIG. 6 schematically illustrates a sectional view of the SOI RF device shown in FIG. 4 along a B-B line.
Figure 6:
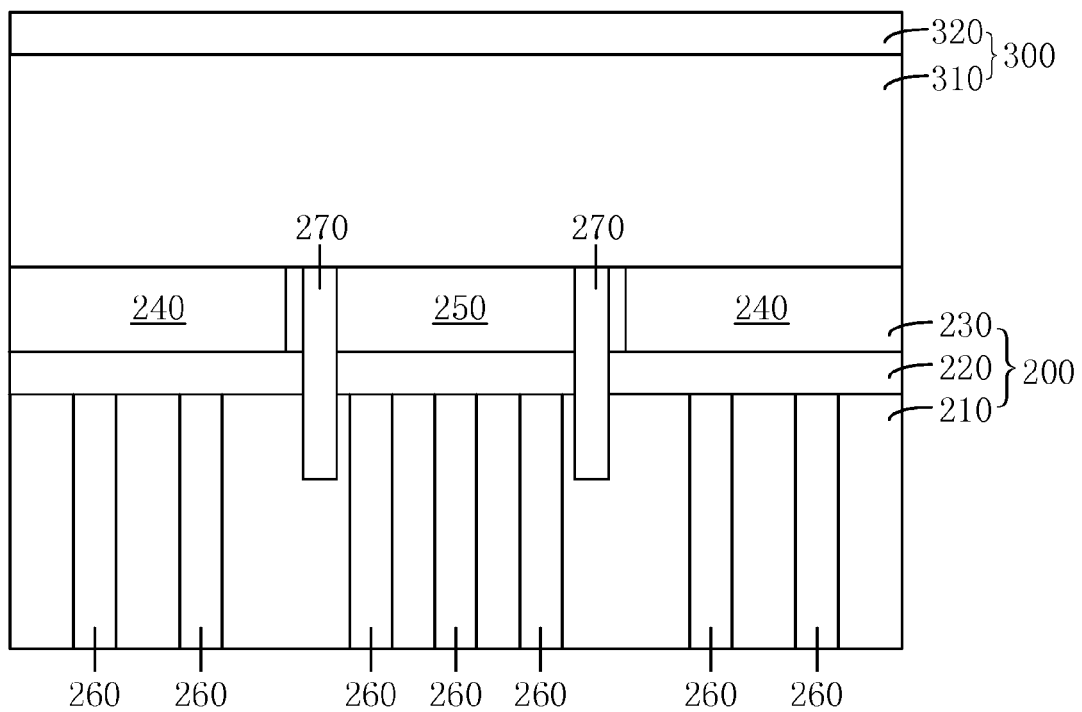

Based on the above embodiment, this embodiment provides another SOI RF device. FIG. 4 schematically illustrates an upward view of the SOI RF device according to an embodiment of the present disclosure. FIG. 5 schematically illustrates a vertical view of the SOI RF device shown in FIG. 4. And FIG. 6 schematically illustrates a sectional view of the SOI RF device shown in FIG. 4 along a B-B line. Referring to FIGS. 4 to 6, differences between the SOI RF device in this embodiment and that in the above embodiment may be as follows. At least one second pit 270 is further formed in the SOI substrate and an opening of the at least one second pit 270 faces a surface of the STI structure 250 which is away from the buried oxide layer 220 (i.e., an upper surface of the STI structure 250). The at least one second pit 270 extends along a thickness direction of the SOI substrate and penetrates the STI structure 250 (extending directions of the first pit 260 and the second pit 270 are opposite), the buried oxide layer 220 and a portion of the high resistivity silicon plate 210.

In some embodiments, the at least one second pit 270 may have various shapes. In some embodiments, to simply a manufacturing process of the second pit 270, the second pit 270 may be a via. In some embodiments, the second pit 270 may be a trench. It should be noted that, the shape and distribution of the at least one second pit 270 are not limited to embodiments described here and the accompanying figures. When at least two second pits 270 are formed in the SOI substrate 200 and the at least two second pits 270 are vias, two adjacent vias are arranged with an interval therebetween. When at least two second pits 270 are formed in the SOI substrate 200 and the at least two second pits 270 are trenches, two adjacent trenches are arranged with an interval therebetween or arranged across each other.

The number and a cross section area of the at least one second pit 270 in the SOI substrate 200 may influence an equivalent surface resistance of the high resistivity silicon plate 210. The more the number of the at least one second pit 270 is or the greater the cross section area of the at least one second pit 270 is, the greater the equivalent surface resistance of the high resistivity silicon plate 210 is, which greatly reduces an eddy current generated on a surface of the high resistivity silicon plate 210. Considering that the high resistivity silicon plate 210 needs to provide mechanical support for above structures (i.e, the buried oxide layer 220 and the top silicon layer 230), the number and the cross section area of the at least one second pit 270 should be set reasonably to ensure an adequate support strength. In some embodiments, the second pit 270 may be formed by a dry etching process. The smaller the cross section area of the second pit 270 is, the more complicated the process for forming the second pit 270 is. Therefore, the cross section area of the second pit 270 should be set based on the ability of existing etching processes. In some embodiments, when the second pit 270 is a via, a diameter thereof may be set between about 0.2 µm to about 1 mm.

Since an eddy current is only generated on a surface of the high resistivity silicon plate 210 which is close to the buried oxide layer 220, to increase a surface resistance of the high resistivity silicon plate 210, the second pit 270 may be enabled to penetrate a portion of the high resistivity silicon plate 210. Besides, the greater the depth of the second pit 270 is, the more complicated the manufacturing process of the second pit 270 is. In consideration of above factors, in some embodiments, the second pit 270 may extend for about 1 percent to about 90 percent of a thickness of the high resistivity silicon plate 210.

In some embodiments, the at least one second pit 270 may be formed after the semiconductor devices are formed in the active regions 240 and before the metal interconnect structure 300 is formed. To avoid subjects, such as metal particles, entering the at least one second pit 270 to influence electric performance of the SOI RF device in subsequent processes after the at least one second pit 270 is formed, an insulating material, such as silicon oxide and silicon nitride, may be filled into the at least one second pit 270. The smaller the depth of the second pit 270 is, the easier to fill an insulating material into the second pit 270 is.

Figure 7:
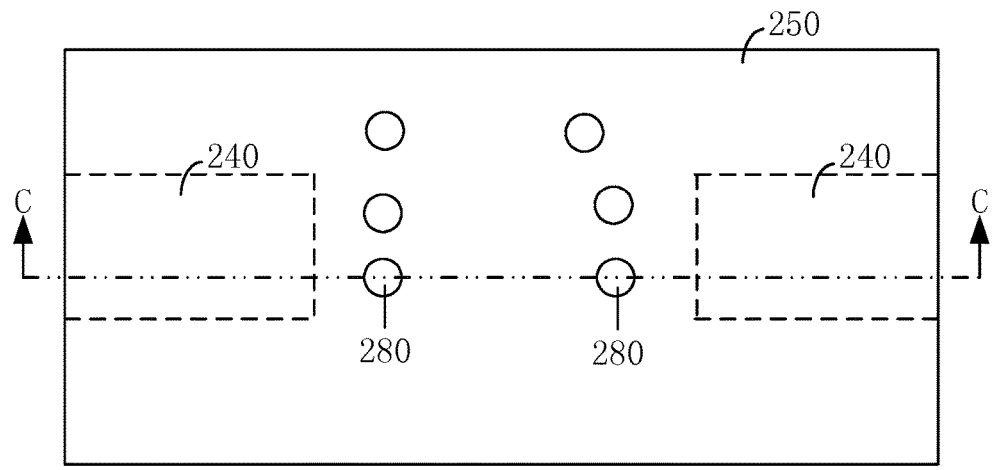
FIG. 7 schematically illustrates a vertical view of a SOI RF device according to another embodiment of the present disclosure.
Figure 8:
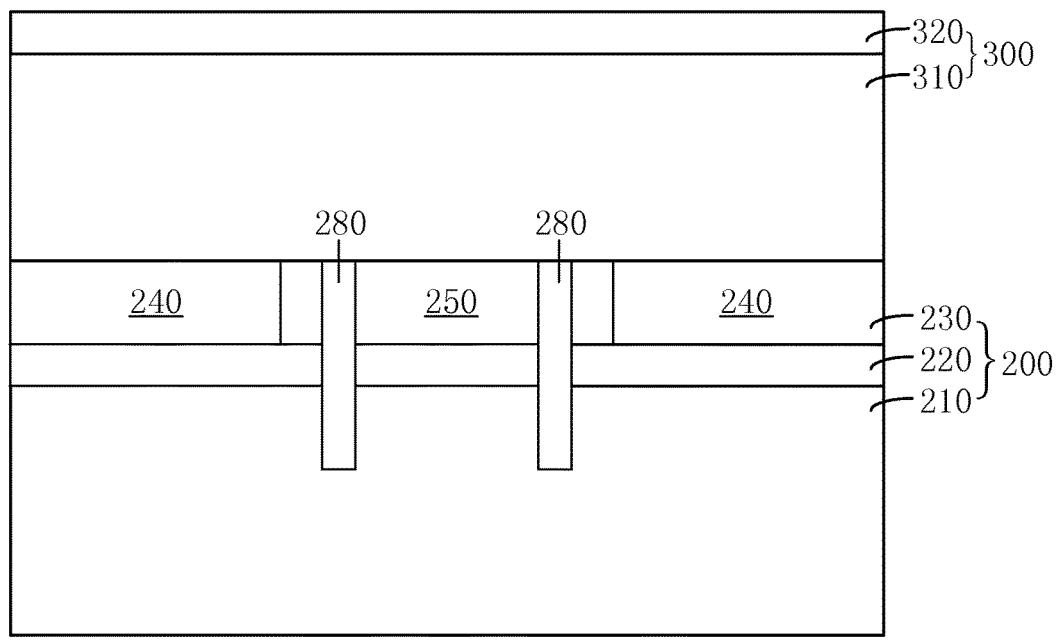
FIG. 8 schematically illustrates a sectional view of the SOI RF device shown in FIG. 7 along a C-C line.

FIG. 7 schematically illustrates a vertical view of a SOI RF device according to an embodiment of the present disclosure and FIG. 8 schematically illustrates a sectional view of the SOI RF device shown in FIG. 7 along a C-C line. Referring to FIGS. 7 and 8, a SOI RF device 100 includes a SOI substrate 200 and a metal interconnect structure 300 formed on the SOI substrate 200. A plurality of semiconductor devices are formed in the SOI substrate 200. The metal interconnect structure 300 may connect the plurality of semiconductor devices to form a desired circuit.

In some embodiments, the SOI substrate 200 may include a high resistivity silicon plate 210, a top silicon layer 230 and a buried oxide layer 220 between the high resistivity silicon plate 210 and the top silicon layer 230. The high resistivity silicon plate 210 is adapted to provide mechanical support for the buried oxide layer 220 and the top silicon layer 230. The top silicon layer 230 may be adapted to manufacture semiconductor devices required in a circuit. At least two active regions 240 are formed in the top silicon layer 230. A plurality of kinds of semiconductor devices, such as a p-n junction diode, a bipolar transistor (BJT), a Schottky diode and a field-effect transistor (FET), are formed in the at least two active regions 240. Two adjacent active regions 240 are separated by a STI structure 250.

At least one pit 280 is formed in the SOI substrate 200. An opening of the pit 280 faces a surface of the STI structure 250 which is away from the buried oxide layer 220 (i.e., an upper surface of the STI structure 250). In some embodiments, the at least one pit 280 extends along a thickness direction of the SOI substrate 200 and penetrates the STI structure 250, the buried oxide layer 220 and a portion of the high resistivity silicon plate 210.

In some embodiments, the at least one pit 280 may have various shapes. In some embodiments, to simply a manufacturing process of the pit 280, the pit 280 may be a via. In some embodiments, the pit 280 may be a trench. It should be noted that, the shape and distribution of the at least one pit 280 are not limited to embodiments described here and the accompanying figures. When at least two pits 280 are formed in the SOI substrate 200 and the at least two pits 280 are vias, two adjacent vias are arranged with an interval therebetween. When at least two pits 280 are formed in the SOI substrate 200 and the at least two pits 280 are trenches, two adjacent trenches are arranged with an interval therebetween or arranged across each other.

The number and a cross section area of the at least one pit 280 in the SOI substrate 200 may influence an equivalent surface resistance of the high resistivity silicon plate 210. The more the number of the at least one pit 280 is or the greater the cross section area of the at least one pit 280 is, the greater the equivalent surface resistance of the high resistivity silicon plate 210 is, which greatly reduces an eddy current generated on a surface of the high resistivity silicon plate 210. Considering that the high resistivity silicon plate 210 needs to provide mechanical support for above structures (i.e, the buried oxide layer 220 and the top silicon layer 230), the number and the cross section area of the at least one pit 280 should be set reasonably to ensure an adequate support strength. In some embodiments, the pit 280 may be formed by a dry etching process. The smaller the cross section area of the pit 280 is, the more complicated the process for forming the pit 280 is. Therefore, the cross section area of the pit 280 should be set based on the ability of existing etching processes. In some embodiments, when the pit 280 is a via, a diameter thereof may be set between about 0.2 μm to about 1 mm.

Since an eddy current is only generated on a surface of the high resistivity silicon plate 210 which is close to the buried oxide layer 220, to increase a surface resistance of the high resistivity silicon plate 210, the pit 280 may be enabled to penetrate a portion of the high resistivity silicon plate 210. Besides, the greater the depth of the pit 280 is, the more complicated the manufacturing process of the pit 280 is. In consideration of above factors, in some embodiments, the pit 280 may extend for about 1 percent to about 90 percent of a thickness of the high resistivity silicon plate 210.

In some embodiments, the at least one pit 280 may be formed after the semiconductor devices are formed in the active regions 240 and before the metal interconnect structure 300 is formed. To avoid subjects, such as metal particles, entering the at least one pit 280 to influence electric performance of the SOI RF device in subsequent processes after the at least one pit 280 is formed, an insulating material, such as silicon oxide and silicon nitride, may be filled into the at least one pit 280. The smaller the depth of the pit 280 is, the easier to fill an insulating material into the pit 280 is. It should be noted that, when the pit 280 has a great depth-to-width ratio, an insulating material may not fill the pit 280 and this does not influence applications of the present disclosure.

In some embodiments, the SOI RF device may be a RF switch, which requires high linearity and low insertion loss.

Figure 9:
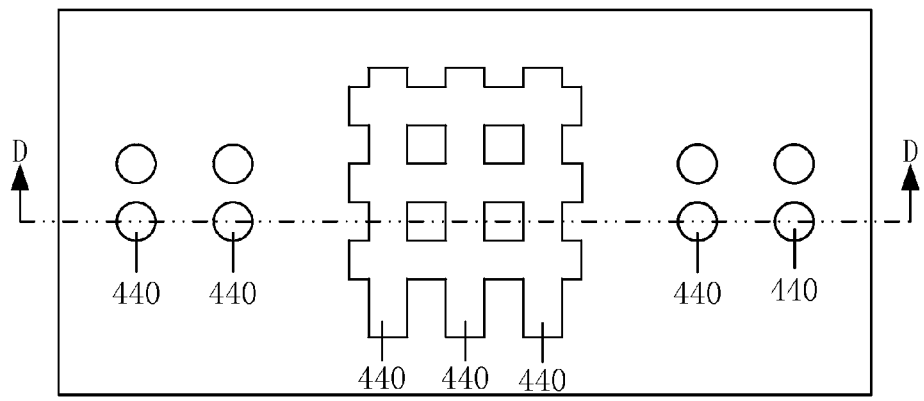
FIG. 9 schematically illustrates an upward view of a SOI substrate according to one embodiment of the present disclosure.
Figure 10:
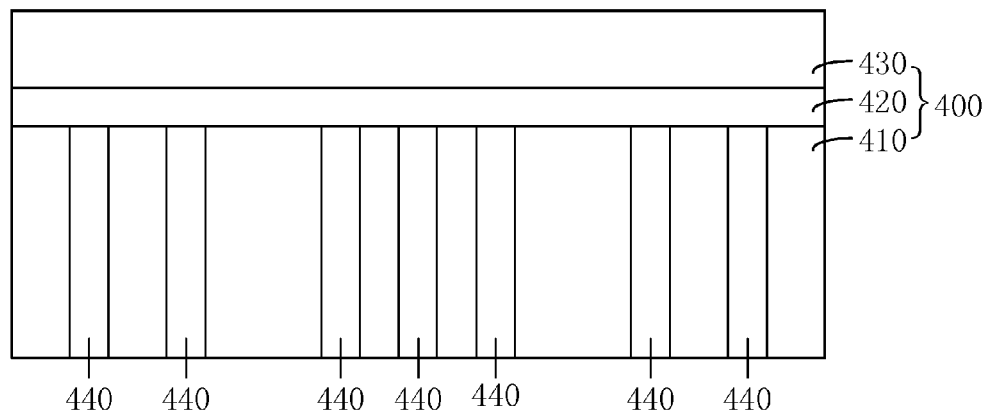
FIG. 10 schematically illustrates a sectional view of the SOI substrate shown in FIG. 9 along a D-D line.

Referring to FIGS. 9 and 10, a SOI substrate 400 is provided. The SOI substrate 400 includes a high resistivity silicon plate 410, a top silicon layer 430 and a buried oxide layer 420 between the high resistivity silicon plate 410 and the top silicon layer 430. At least one pit 440 is formed in the silicon-on-insulator SOI substrate 400 and an opening of the at least one pit 440 faces a surface of the high resistivity silicon plate 410 which is away from the buried oxide layer 420 (i.e., a lower surface of the high resistivity silicon plate 410). The at least one pit 440 extends along a thickness direction of the SOI substrate 400 and penetrates through the high resistivity silicon plate 410, that is, a depth of the at least one pit 440 is greater than or equal to a thickness of the high resistivity silicon plate 410. In some embodiments, the at least one pit 440 exactly penetrates the high resistivity silicon plate 410, that is, the depth of the at least one pit 440 is equal to the thickness of the high resistivity silicon plate 410. In some embodiments, the at least one pit 440 penetrates the high resistivity silicon plate 410 and a portion of the buried oxide layer 420, that is, the depth of the at least one pit 440 is greater than the thickness of the high resistivity silicon plate 410 and smaller than a sum of the thickness of the high resistivity silicon plate 410 and a thickness of the buried oxide layer 420. In some embodiments, the at least one pit 440 penetrates the high resistivity silicon plate 410 and the buried oxide layer 420, the depth of the at least one pit 440 is equal to a sum of the thickness of the high resistivity silicon plate 410 and the thickness of the buried oxide layer 420.

In some embodiments, the at least one pit 440 may have various shapes. In some embodiments, to simply a manufacturing process of the pit 440, the pit 440 may be a via. In some embodiments, the pit 440 may be a trench. It should be noted that, the shape and distribution of the at least one pit 440 are not limited to embodiments described here and the accompanying figures. When at least two pits 440 are formed in the SOI substrate 400 and the at least two pits 440 are vias, two adjacent vias are arranged with an interval therebetween. When at least two pits 440 are formed in the SOI substrate 400 and the at least two pits 440 are trenches, two adjacent trenches are arranged with an interval therebetween (arranged in parallel in FIG. 9) or arranged across each other (arranged perpendicular to each other in FIG. 9).

The pit 440 may at least penetrate the high resistivity silicon plate 410, that is, the depth of the pit 440 is greater than or equal to the thickness of the high resistivity silicon plate 410. Since the thickness of the high resistivity silicon plate 410 is relatively great, the depth of the pit 440 is relatively great as well and a manufacturing process thereof may be very complicated. Since an eddy current is only generated on a surface of the high resistivity silicon plate 410, the pit 440 may be enabled to penetrate the high resistivity silicon plate 410 to the surface thereof which is close to the buried oxide layer 420, thereby increasing an equivalent surface resistance of the high resistivity silicon plate 410. In some embodiments, the pit 440 may exactly penetrate the high resistivity silicon plate 410.

In some embodiments, the at least one pit 440 may be filled with an insulating material, such as a material having good insulating performance, including silicon oxide or silicon nitride. In some embodiments, no material is filled into the at least one pit 440. In such, the at least one pit 440 remains a vacuum state or only contacts with air. No matter the at least one pit 440 is filled with an insulating material or not, the surface resistance of the high resistivity silicon plate 410 is increased. Further, an eddy current generated on a surface of the high resistivity silicon plate 410 may be reduced. The at least one pit 440 may be formed in the SOI substrate 400 in advance according to detailed structures of a SOI RF device to be formed.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A silicon-on-insulator radio frequency device, comprising:
a silicon-on-insulator substrate, the silicon-on-insulator substrate comprising a high resistivity silicon plate, a top silicon layer and a buried oxide layer between the high resistivity silicon plate and the top silicon layer, wherein at least two active regions are formed in the top silicon layer and a shallow trench isolation structure is formed to separate two adjacent active regions of the at least two active regions; and
a metal interconnect structure formed on the top silicon layer and the shallow trench isolation structure, the metal interconnect structure comprising an interlayer dielectric layer that is formed on the top silicon layer and the shallow trench isolation structure and a metal layer that is formed on the interlayer dielectric layer;
wherein the silicon-on-insulator radio frequency device further comprises a first pit formed in the silicon-on-insulator substrate, wherein the number of the first pit is at least one, an opening of the first pit faces a surface of the high resistivity silicon plate that is away from the buried oxide layer, the first pit extends along a thickness direction of the silicon-on-insulator substrate and penetrates through the high resistivity silicon plate, the first pit has a hollow structure, and at least one of the first pit is disposed directly under one of the at least two active regions.

2. The silicon-on-insulator radio frequency device according to claim 1, wherein at least one of the first pit is disposed directly under the shallow trench isolation structure.

3. The silicon-on-insulator radio frequency device according to claim 2, wherein the at least one of the first pit directly under the shallow trench isolation structure exactly penetrates the high resistivity silicon plate, or penetrates the high resistivity silicon plate and a portion of the buried oxide layer, or penetrates the high resistivity silicon plate and the buried oxide layer, or penetrates the high resistivity silicon plate, the buried oxide layer and a portion of the shallow trench isolation structure.

4. The silicon-on-insulator radio frequency device according to claim 1, wherein the at least one of the first pit directly under the at least two active regions exactly penetrates the high resistivity silicon plate, or penetrates the high resistivity silicon plate and a portion of the buried oxide layer, or penetrates the high resistivity silicon plate and the buried oxide layer.

5. The silicon-on-insulator radio frequency device according to claim 1, wherein the number of the first pit is at least two, at least one of the first pit is disposed directly under the shallow trench isolation structure and at least one of the first pit is disposed directly under the at least two active regions.

6. The silicon-on-insulator radio frequency device according to claim 5, wherein the at least one of the first pit directly under the shallow trench isolation structure exactly penetrates the high resistivity silicon plate, or penetrates the high resistivity silicon plate and a portion of the buried oxide layer, or penetrates the high resistivity silicon plate and the buried oxide layer, or penetrates the high resistivity silicon plate, the buried oxide layer and a portion of the shallow trench isolation structure; and the at least one of the first pit directly under the at least two active regions exactly penetrates the high resistivity silicon plate, or penetrates the high resistivity silicon plate and a portion of the buried oxide layer, or penetrates the high resistivity silicon plate and the buried oxide layer.

7. The silicon-on-insulator radio frequency device according to claim 1, wherein the first pit is a via or a trench.

8. The silicon-on-insulator radio frequency device according to claim 7, wherein the first pit comprises at least two vias and two adjacent vias are arranged with an interval therebetween; or the first pit comprises at least two trenches and two adjacent trenches are arranged with an interval therebetween or arranged across each other.

9. The silicon-on-insulator radio frequency device according to claim 1, wherein the insulating material comprises silicon oxide or silicon nitride.

10. The silicon-on-insulator radio frequency device according to claim 1, further comprising a second pit formed in the silicon-on-insulator substrate, wherein the number of the second pit is at least one, an opening of the second pit faces a surface of the shallow trench isolation structure that is away from the buried oxide layer, and the second pit extends along the thickness direction of the silicon-on-insulator substrate, penetrates the shallow trench isolation structure, the buried oxide layer and a portion of the high resistivity silicon plate and is filled with an insulating material.

11. The silicon-on-insulator radio frequency device according to claim 10, wherein the insulating material is silicon oxide or silicon nitride.

12. The silicon-on-insulator radio frequency device according to claim 10, wherein the second pit extends for about 1 percent to about 90 percent of a thickness of the high resistivity silicon plate.

13. The silicon-on-insulator radio frequency device according to claim 10, wherein the second pit is a via or a trench.

14. The silicon-on-insulator radio frequency device according to claim 13, wherein the second pit comprises at least two vias and two adjacent vias are arranged with an interval therebetween, or the second pit comprises at least two trenches and two adjacent trenches are arranged with an interval therebetween or arranged across each other.

15. The silicon-on-insulator radio frequency device according to claim 1, wherein the silicon-on-insulator radio frequency device is a radio frequency switch.

\* \* \* \* \*